United States Patent
Chen et al.

(10) Patent No.: US 10,490,149 B2
(45) Date of Patent: Nov. 26, 2019

(54) DISCHARGING CIRCUIT AND DRIVING METHOD THEREOF, DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Shuai Chen, Beijing (CN); Zhi Zhang, Beijing (CN); Cheng Zuo, Beijing (CN); Heecheol Kim, Beijing (CN); Taeyup Min, Beijing (CN); Zhihui Wang, Beijing (CN); Xiaojun Zuo, Beijing (CN); Xing Dong, Beijing (CN); Wangjing Bai, Beijing (CN); Kangpeng Dang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 42 days.

(21) Appl. No.: 15/767,315

(22) PCT Filed: Oct. 17, 2017

(86) PCT No.: PCT/CN2017/106538
§ 371 (c)(1),
(2) Date: Apr. 10, 2018

(87) PCT Pub. No.: WO2018/176801
PCT Pub. Date: Oct. 4, 2018

(65) Prior Publication Data
US 2019/0066613 A1  Feb. 28, 2019

(30) Foreign Application Priority Data
Mar. 31, 2017 (CN) .......................... 2017 1 0208066

(51) Int. Cl.
G09G 3/36 (2006.01)
G09G 5/00 (2006.01)
(Continued)

(52) U.S. Cl.
CPC ......... G09G 3/3655 (2013.01); G09G 3/2927 (2013.01); G09G 3/3648 (2013.01);
(Continued)

(58) Field of Classification Search
CPC .. G09G 3/2927; G09G 3/0293; G09G 3/3648; G09G 3/3677; G09G 3/3688;
(Continued)

(56) References Cited

U.S. PATENT DOCUMENTS 5,448,384 A * 9/1995 Uchino ................ G09G 3/3648
345/92
2003/0184538 A1 10/2003 Yamato et al.
(Continued)

FOREIGN PATENT DOCUMENTS

CN 1588528 A 3/2005
CN 102867491 A 1/2013
(Continued)

OTHER PUBLICATIONS

CN Office Action for CN Appl. No. 201710208066.3, dated Feb. 12, 2018.
(Continued)

Primary Examiner — Xuemei Zheng
(74) Attorney, Agent, or Firm — Foley & Lardner LLP; James F. Ewing; Paul M. H. Pua

(57) ABSTRACT

The present disclosure relates to a discharging circuit and a driving method thereof, and a display device. The discharging circuit of the present disclosure includes a control circuit, a time delay circuit, a first discharging circuit and a second discharging circuit. The control circuit is configured
(Continued)

to control potential of a control signal output terminal of the control circuit. The time delay circuit is configured to delay a switched-on time of the second discharging circuit. The first discharging circuit is configured to pull down a potential of a data signal terminal to a potential of a common voltage terminal, under control of a control signal output from the control circuit. The second discharging circuit is configured to release the potential of the common voltage terminal and the potential of the data signal terminal under the control of the time delay circuit.

20 Claims, 5 Drawing Sheets

(51) Int. Cl.
*H03K 17/687* (2006.01)
*G09G 3/292* (2013.01)
(52) U.S. Cl.
CPC . *H03K 17/6871* (2013.01); *G09G 2310/0243* (2013.01); *G09G 2310/0245* (2013.01); *G09G 2310/063* (2013.01); *G09G 2310/08* (2013.01); *G09G 2320/0247* (2013.01); *G09G 2320/0257* (2013.01); *G09G 2330/026* (2013.01); *G09G 2330/027* (2013.01)
(58) Field of Classification Search
CPC ......... G09G 3/3655; G09G 2320/0257; G09G 2310/08; G09G 2310/0251; G09G 2310/0248; G09G 2310/063; G09G 2310/066; G09G 2330/027
See application file for complete search history.

(56) References Cited

U.S. PATENT DOCUMENTS

| | | | | |
|---|---|---|---|---|
| 2006/0208994 | A1* | 9/2006 | Kuo | G09G 3/3655 345/98 |
| 2009/0167739 | A1* | 7/2009 | Tsubata | G09G 3/3659 345/208 |
| 2010/0079443 | A1* | 4/2010 | Chang | G09G 3/3677 345/214 |

FOREIGN PATENT DOCUMENTS

| | | |
|---|---|---|
| CN | 104361866 A | 2/2015 |
| CN | 104616632 A | 5/2015 |
| CN | 106710566 A | 5/2017 |

OTHER PUBLICATIONS

International Search Report and Written Opinion for International Appl. No. PCT/CN2017/106538, dated Jan. 19, 2018.

* cited by examiner at a start-up stage, pulling down, by a control circuit, potential of a first node, so as to switch on a first discharging circuit to pull down potential of a data signal terminal to potential of a common voltage terminal; delaying, by a time delay circuit, switch-on of a second discharging circuit, so as to release the potential of the common voltage terminal and the potential of the data signal terminal; meanwhile, charging a first voltage stabilizing circuit, a second voltage stabilizing circuit and the time delay circuit;

at a display stage, promoting, by the control circuit, potential of the first node, so as to switch off the first discharging circuit and the second discharging circuit to cause the data signal terminal, the common voltage terminal and a fifth signal terminal to be disconnected from one another;

at a shutdown stage, under control of a first voltage stabilizing circuit and a second voltage stabilizing circuit, pulling down, by the control circuit, potential of the first node, so as to switch on the first discharging circuit to pull down the potential of the data signal terminal to the potential of the common voltage terminal; delaying, by the time delay circuit, switch-on of the second discharging circuit, so as to release the potential of the common voltage terminal and the potential of the data signal terminal.

FIG. 5

DISCHARGING CIRCUIT AND DRIVING METHOD THEREOF, DISPLAY DEVICE

CROSS-REFERENCE TO RELATED APPLICATIONS

This application is a U.S. National Stage under 35 U.S.C. § 371 of PCT/CN2017/106538, filed on Oct. 17, 2017, which claims priority to Chinese Patent Application No. 201710208066.3 filed on Mar. 31, 2017, the disclosure of which is incorporated by reference herein in its entirety.

TECHNICAL FIELD

The present disclosure relates to a discharging circuit and a driving method thereof, and a display device.

BACKGROUND

GOA (Gate On Array) is a technology to directly manufacture a Gate Driver Circuit on an array substrate, and provision of a corresponding chip and a circuit board can be omitted by it. This is very helpful for reducing cost and narrowing frame.

At present, most display panels adopt the GOA design, in which the number of connection points between a common electrode terminal VCOM and a display panel is decreased, bringing about the fact that the discharge of electricity from VCOM is unduly slow when the display device is shut down. As a result, there remain some charges in the display device, and a voltage difference is formed across liquid crystals. This gives rise to deviation of a voltage-time (V-T) curve, and causes the display device to produce picture flicker or image sticking when it is started up again. Thus, the display quality is affected.

SUMMARY

According to some embodiments of the present disclosure, there is provided a discharging circuit, comprising a control circuit, a time delay circuit, a first discharging circuit and a second discharging circuit; the control circuit being connected to a control signal input terminal, a third signal terminal, a fourth signal terminal, the time delay circuit and the first discharging circuit, and the control circuit being configured to control potential of a control signal output terminal of the control circuit; the time delay circuit also being connected to the first discharging circuit and the second discharging circuit, and being configured to delay a switched-on time of the second discharging circuit; the first discharging circuit also being connected to a data signal terminal and a common voltage terminal, and being configured to pull down a potential of the data signal terminal to a potential of the common voltage terminal, under control of a control signal output from the control circuit; the second discharging circuit also being connected to the common voltage terminal and a fifth signal terminal, and being configured to release the potential of the common voltage terminal and the potential of the data signal terminal under control of the time delay circuit.

In some embodiments, the control circuit is connected to the control signal input terminal, a first node, the third signal terminal, the fourth signal terminal, the time delay circuit and the first discharging circuit, the first node is a node connected among the control circuit, the time delay circuit and the first discharging circuit, and the control circuit is configured to control potential of the first node.

In some embodiments, the control circuit includes a voltage output circuit and a sub-control circuit. The voltage output circuit is connected to the control signal input terminal, a first signal terminal, a second signal terminal and the sub-control circuit, and is configured to transmit a signal input from the first signal terminal or a signal input from the second signal terminal to the sub-control circuit in light of a signal input from the control signal input terminal. The sub-control circuit is also connected to the first node, the third signal terminal, the fourth signal terminal, the time delay circuit and the first discharging circuit, and is configured to output a control signal under control of a voltage output from the voltage output circuit.

In some embodiments, the sub-control circuit includes a first transistor and a second transistor; wherein on-off characteristics of the first transistor and the second transistor are contrary. A base of the first transistor is connected to the voltage output circuit and a base of the second transistor, an emitter of the first transistor is connected to the third signal terminal, and a collector of the first transistor is connected to the first node. A base of the second transistor is connected to the voltage output circuit, an emitter of the second transistor is connected to the fourth signal terminal, and a collector of the second transistor is connected to the first node.

In some embodiments, the voltage output circuit includes an amplifier. An input terminal of the amplifier is connected to the control signal input terminal, a non-inverting input terminal of the amplifier is connected to the first signal terminal, and an inverting input terminal of the amplifier is connected to the second signal terminal.

In some embodiments, the first discharging circuit includes a third transistor, and on-off characteristics of the third transistor and the first transistor are the same. A base of the third transistor is connected to the first node and the time delay circuit, an emitter of the third transistor is connected to the common voltage terminal and the second discharging circuit, and a collector of the third transistor is connected to the data signal terminal.

In some embodiments, the second discharging circuit includes a fourth transistor, and on-off characteristics of the fourth transistor and the first transistor are the same. A base of the fourth transistor is connected to the time delay circuit, an emitter of the fourth transistor is connected to the common voltage terminal, and a collector of the fourth transistor is connected to the time delay circuit and the fifth signal terminal.

In some embodiments, the time delay circuit includes a first resistor and a second resistor. A first end of the first resistor is connected to the first node and the first discharging circuit, and a second end of the first resistor is connected to a first end of the second resistor and the second discharging circuit. A second end of the second resistor is connected to the fifth signal terminal and the second discharging circuit.

In some embodiments, the time delay circuit further comprises a third capacitor; a first end of the third capacitor is connected to the second end of the first resistor, the first end of the second resistor and the second discharging circuit, and a second end of the third capacitor is connected to the second discharging circuit, the second end of the second resistor and the fifth signal terminal.

In some embodiments, the discharging circuit further comprises a first voltage stabilizing circuit and a second voltage stabilizing circuit; the first voltage stabilizing circuit is connected to the control circuit, the fourth signal terminal, the second voltage stabilizing circuit, the fifth signal terminal and the time delay circuit, and is configured to provide the control circuit with a stabilized voltage; the second voltage stabilizing circuit is connected to the first node, the fifth signal terminal, the first discharging circuit and the time delay circuit, and configured to provide the first node with a stabilized voltage.

In some embodiments, the first voltage stabilizing circuit includes a first capacitor the second voltage stabilizing circuit includes a second capacitor. A first end of the first capacitor is connected to the control circuit and the fourth signal terminal, and a second end of the first capacitor is connected to a second end of the second capacitor, the fifth signal terminal and the time delay circuit. A first end of the second capacitor is connected to the first node, the first discharging circuit and the time delay circuit, and the second end of the second capacitor is also connected to the fifth signal terminal and the time delay circuit.

According to some other embodiments of the present disclosure, there is provided a display device, comprising the discharging circuit as stated above.

According to some other embodiments of the present disclosure, there is provided a driving method of a discharging circuit, comprising at a start-up stage, pulling down, by a control circuit, potential of a first node, so as to switch on a first discharging circuit to pull down a potential of a data signal terminal to a potential of a common voltage terminal; delaying, by a time delay circuit, switch-on of a second discharging circuit, so as to release the potential of the common voltage terminal and the potential of the data signal terminal; meanwhile, charging a first voltage stabilizing circuit, a second voltage stabilizing circuit and the time delay circuit;

at a display stage, promoting, by the control circuit, potential of the first node, so as to switch off the first discharging circuit and the second discharging circuit to cause the data signal terminal, the common voltage terminal and a fifth signal terminal to be disconnected from one another;

at a shutdown stage, under control of a first voltage stabilizing circuit and a second voltage stabilizing circuit, pulling down, by the control circuit, potential of the first node, so as to switch on the first discharging circuit to pull down the potential of the data signal terminal to the potential of the common voltage terminal; delaying, by the time delay circuit, switch-on of the second discharging circuit, so as to release the potential of the common voltage terminal and the potential of the data signal terminal.

BRIEF DESCRIPTION OF THE DRAWINGS

FIG. 5 is a schematically flowchart showing a driving method of a discharging circuit according to some embodiments of the present disclosure.

DETAILED DESCRIPTION

Figure 1:
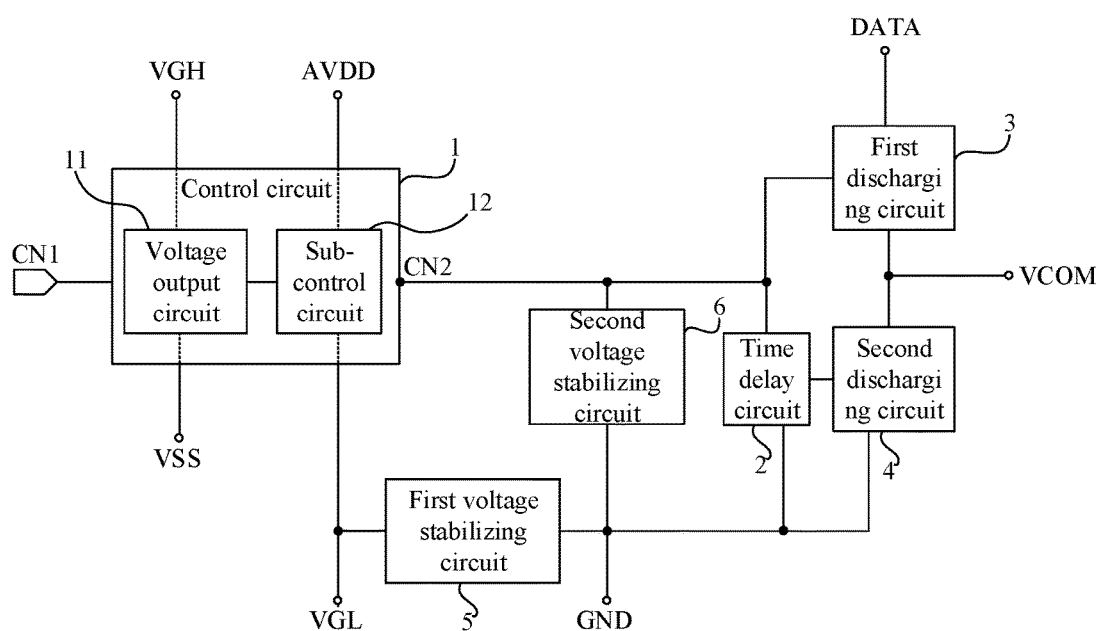
FIG. 1 is a structurally schematic view showing a discharging circuit according to some embodiments of the present disclosure.

In order to make the technical solutions of the present disclosure more comprehensible by those skilled in the art, the present disclosure will be described in further detail below in combination with the accompanying drawings and embodiments.

Transistors used in some embodiments of the present disclosure are triodes or like devices of other characteristics. When discrimination is made according to characteristics of triodes, triodes can be classified into two kinds: a PNP type and a NPN type. In some embodiments of the present disclosure, description will be made on the case where a first transistor T1, a third transistor T3 and a fourth transistor T4 are PNP-type triodes, and a second transistor T2 is a NPN-type triode in the following embodiments. Provided that a PNP-type triode is adopted, when a high level is input to a base of the triode, an emitter and a collector of the triode are each reverse biased, so that the triode is not conducting, and an NPN-type triode is the opposite. It is conceivable that, a solution in which triodes whose on-off characteristic is contrary to that in some embodiments of the present disclosure are adopted to achieve technical effects of the present disclosure, can be readily conceived by those skilled in the art without creative work, and therefore, it also falls within the protection scope of the present disclosure.

In some embodiments of the present disclosure, potential of a first signal terminal VGH is a high level, which is a turned-on potential of a gate electrode; potential of a second signal terminal VSS is a low level, and is smaller than potential of a fourth signal terminal VGL; potential of a third signal terminal AVDD is a high level; potential of the fourth signal terminal VGL is a low level, which is a turned-off potential of the gate electrode; and potential of a fifth signal terminal GND is a grounding voltage.

In at least one embodiment of the present disclosure, there is provided a discharging circuit, including a control circuit, a time delay circuit, a first discharging circuit and a second discharging circuit;

wherein, the control circuit is connected to a control signal input terminal, a third signal terminal, a fourth signal terminal, the time delay circuit and the first discharging circuit, and the control circuit is configured to control potential of a control signal output terminal of the control circuit;

the time delay circuit is also connected to the first discharging circuit and the second discharging circuit, and configured to delay a switched-on time of the second discharging circuit;

the first discharging circuit is also connected to a data signal terminal and a common voltage terminal, and configured to pull down a potential of the data signal terminal to a potential of the common voltage terminal, under the control of a control signal output from the control circuit;

the second discharging circuit is also connected to the common voltage terminal and a fifth signal terminal, and configured to release potential of the common voltage terminal and the pulled-down potential of the data signal terminal under the control of the time delay circuit.

Hereinafter, some concrete implementations of a discharging circuit according to embodiments of the present disclosure will be described in conjunction with accompanying drawings.

Figure 2:
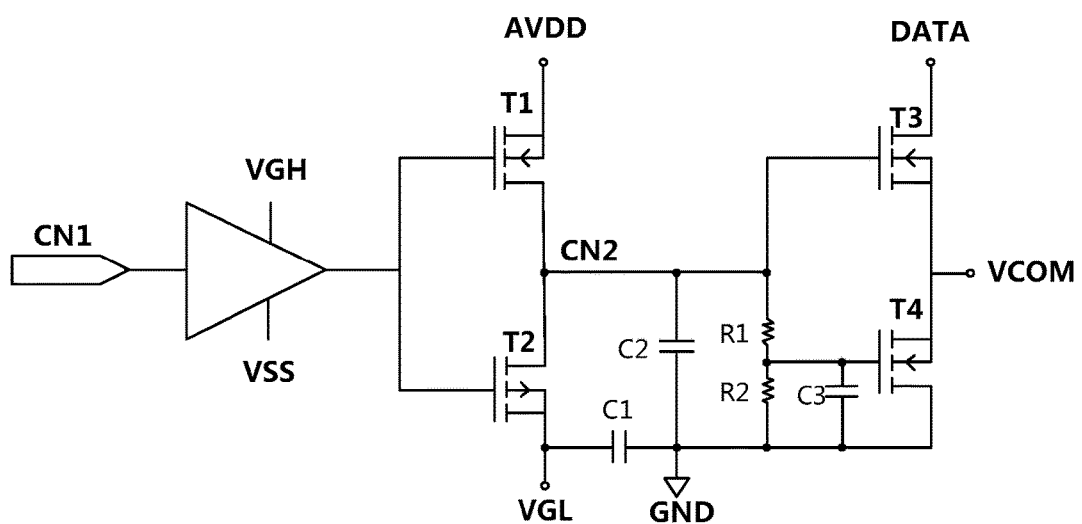
FIG. 2 is a diagram showing the circuit principle of a discharging circuit according to some embodiments of the present disclosure.
Figure 3:
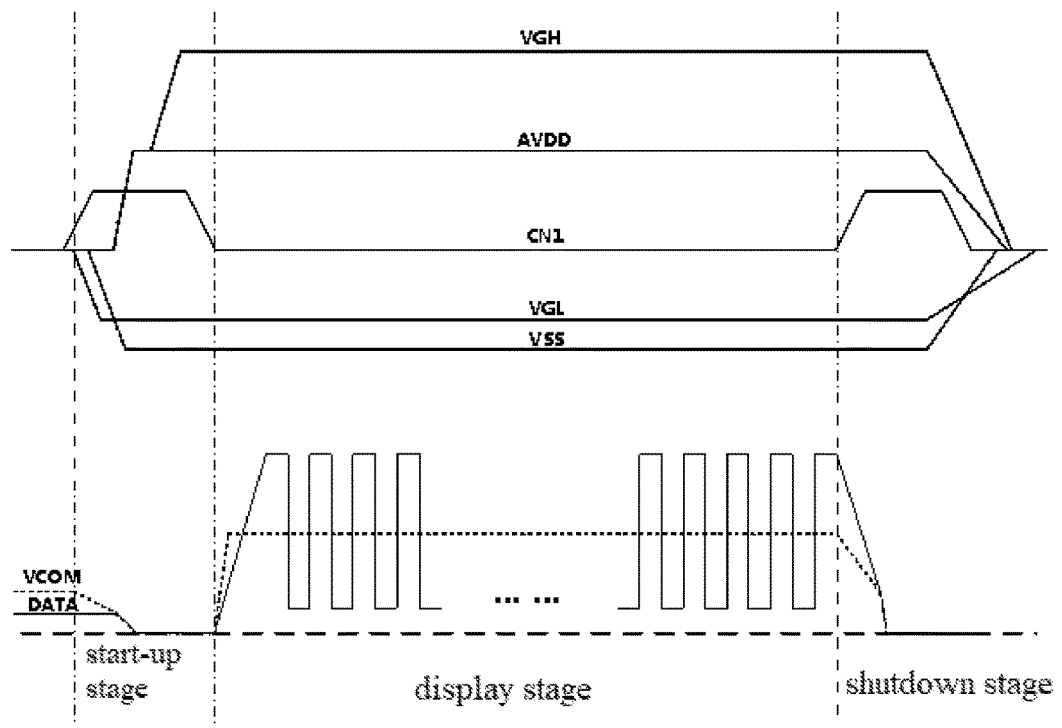
FIG. 3 is a diagram showing the work timing of a discharging circuit according to some embodiments of the present disclosure.

Referring to FIG. 1 to FIG. 3, according to at least one embodiment of the present disclosure, there is provided a discharging circuit, including a control circuit 1, a time delay circuit 2, a first discharging circuit 3 and a second discharging circuit 4.

The control circuit 1 is connected to a control signal input terminal CN1, a first node CN2, a third signal terminal AVDD, a fourth signal terminal VGL, a time delay circuit 2 and a first discharging circuit 3. The first node CN2 is a node connected among the control circuit 1, the time delay circuit 2 and the first discharging circuit 3, and the control circuit 1 is configured to control potential of the first node CN2.

The time delay circuit 2 is also connected to the first discharging circuit 3 and the second discharging circuit 4, and configured to delay a switched-on time of the second discharging circuit 4.

The first discharging circuit 3 is also connected to a data signal terminal DATA and a common voltage terminal VCOM, and configured to pull down a potential of the data signal terminal DATA to a potential of the common voltage terminal VCOM, under the control of a control signal output from the control circuit 1.

The second discharging circuit 4 is also connected to the common voltage terminal VCOM and a fifth signal terminal GND, and configured to release potential of the common voltage terminal VCOM and the pulled-down potential of the data signal terminal DATA, under the control of the time delay time 2.

As can be seen from FIG. 1, the control circuit 1, the time delay circuit 2 and the first discharging circuit 3 each are connected to a second voltage stabilizing circuit 6.

At start-up stage, a high level is input from the control signal input terminal CN1 to the control circuit 1, and a low level is input from the control circuit 1 to the first node CN2, so as to switch on the first discharging circuit 3. A passage is formed between the data signal terminal DATA and the common electrode terminal VCOM, so as to pull down potential of the data signal terminal DATA to be the same as potential of the common electrode terminal VCOM, and thereby a voltage difference across liquid crystals is eliminated. The second discharging circuit 4 is switched on later than the first discharging circuit 3 under the control of the time delay circuit 2, and after the second discharging circuit 4 is switched on, residual charges at the pulled-down data signal terminal DATA and residual charges at the common electrode terminal VCOM are released through the fifth signal terminal GND.

At display stage, a low level is input from the control signal input terminal CN1 to the control circuit 1, and a high level is input from the control circuit 1 to the first node CN2, so as to switch off the first discharging circuit 3 and the second discharging circuit 4. This causes the common voltage terminal VCOM, the data signal terminal DATA and the fifth signal terminal GND to be disconnected from one another, namely, there is no discharge of electricity. But at display stage, the common voltage terminal VCOM, the data signal terminal DATA and the fifth signal terminal GND each have signals to input to a display panel.

At shutdown stage, a high level is input from the control signal input terminal CN1 to the control circuit 1, and a low level is input from the control circuit 1 to the first node CN2, so as to switch on the first discharging circuit 3. A passage is formed between the data signal terminal DATA and the common electrode terminal VCOM, so as to pull down potential of the data signal terminal DATA to be the same as potential of the common electrode terminal VCOM, and thereby a voltage difference across liquid crystals is eliminated. The second discharging circuit 4 is switched on later than the first discharging circuit 3 under the control of the time delay circuit 2, and after the second discharging circuit 4 is switched on, residual charges at the pulled-down data signal terminal DATA and residual charges at the common electrode terminal VCOM are released through the fifth signal terminal GND. Therefore, in this discharging circuit, residual charges at the data signal terminal and the common voltage terminal are conducted out by the first discharging circuit 3 and the second discharging circuit 4, so as to avoid such a problem that when the machine is shut down, a voltage difference is formed across liquid crystals owing to the fact that there remain some charges in the display device as a result of discharge of electricity from the common voltage terminal being unduly slow, and this will produce flicker or image sticking when the machine is started up again. Thus, the display quality is improved.

In some embodiments, the control circuit 1 includes a voltage output circuit 11 and a sub-control circuit 12.

The voltage output circuit 11 is connected to the control signal input terminal CN1, a first signal terminal VGH, a second signal terminal VSS and the sub-control circuit 12, and configured to transmit a signal input from the first signal terminal VGH or a signal input from the second signal terminal VSS to the sub-control circuit 12 in light of a signal input from the control signal input terminal CN1.

The sub-control circuit 12 is also connected to the first node CN2, the third signal terminal AVDD, the fourth signal terminal VGL, the time delay circuit 2 and the first discharging circuit 3, and configured to output a control signal under the control of a voltage output from the voltage output circuit 11.

As shown in FIG. 2, in some embodiments, the sub-control circuit 12 includes a first transistor T1 and a second transistor T2. On-off characteristics of the first transistor T1 and the second transistor T2 are contrary. A base of the first transistor T1 is connected to the voltage output circuit 11 and a base of the second transistor T2, an emitter of the first transistor T1 is connected to the third signal terminal AVDD, and a collector of the first transistor T1 is connected to the first node CN2.

A base of the second transistor T2 is connected to the voltage output circuit 11, an emitter of the second transistor T2 is connected to the fourth signal terminal VGL, and a collector of the second transistor T2 is connected to the first node CN2.

In some embodiments, the voltage output circuit 11 includes an amplifier. An input terminal of the amplifier is connected to the control signal input terminal CN1, a non-inverting input terminal of the amplifier is connected to the first signal terminal VGH, and an inverting input terminal of the amplifier is connected to the second signal terminal VSS.

In some embodiments, the first discharging circuit 3 includes a third transistor T3, and on-off characteristics of the third transistor T3 and the first transistor T1 are the same. A base of the third transistor T3 is connected to the first node CN2 and the time delay circuit 2, an emitter of the third transistor T3 is connected to the common voltage terminal VCOM and the second discharging circuit 4, and a collector of the third transistor T3 is connected to the data signal terminal DATA.

In some embodiments, the second discharging circuit 4 includes a fourth transistor T4, and on-off characteristics of fourth transistor T4 and the first transistor T1 are the same. A base of the fourth transistor T4 is connected to the time delay circuit 2, an emitter of the fourth transistor T4 is connected to the common voltage terminal VCOM, and a collector of the fourth transistor T4 is connected to the time delay circuit 2 and the fifth signal terminal GND.

In some embodiments, the time delay circuit 2 includes a first resistor R1 and a second resistor R2. A first end of the first resistor R1 is connected to the first node CN2 and the first discharging circuit 3, and a second end of the first resistor R1 is connected to a first end of the second resistor R2 and the second discharging circuit 4. A second end of the second resistor R2 is connected to the fifth signal terminal GND and the second discharging circuit 4.

In some embodiments, the time delay circuit 2 further includes a third capacitor C3. A first end of the third capacitor C3 is connected to the second end of the first resistor R1, the first end of the second resistor R2 and the second discharging circuit 4, and a second end of the third capacitor C3 is connected to the second discharging circuit 4, the second end of the second resistor R2 and the fifth signal terminal GND.

In some embodiments, the discharging circuit further includes a first voltage stabilizing circuit 5 and a second voltage stabilizing circuit 6.

The first voltage stabilizing circuit 5 is connected to the control circuit 1, the fourth signal terminal VG1, the second voltage stabilizing circuit 6, the fifth signal terminal GND and the time delay circuit 2, and configured to provide the control circuit 1 with a stabilized voltage.

The second voltage stabilizing circuit 6 is connected to the first node CN2, the fifth signal terminal GND, the first discharging circuit 3 and the time delay circuit 2, and configured to provide the first node CN2 with a stabilized voltage.

In some embodiments, the first voltage stabilizing circuit 5 includes a first capacitor C1. The second voltage stabilizing circuit 6 includes a second capacitor C2.

A first end of the first capacitor C1 is connected to the control circuit 1 and the fourth signal terminal VGL, and a second end of the first capacitor C1 is connected to a second end of the second capacitor C2, the fifth signal terminal GND and the time delay circuit 2. A first end of the second capacitor C2 is connected to the first node CN2, the first discharging circuit 3 and the time delay circuit 2, and the second end of the second capacitor C2 is also connected to the fifth signal terminal GND and time delay circuit 2.

Specifically, operational principle of a discharging circuit according to some embodiments of the present disclosure will be described below in accordance with a timing diagram shown in FIG. 3.

At start-up stage, a high level is input from a control signal input terminal CN1 to an amplifier. The high-level signal input at a non-inverting input terminal of the amplifier does not reach VGH directly when it is output from an output terminal, but slowly rises from a low level to VGH. Moreover, in this course, a voltage input at a third signal terminal connected to a collector of a first transistor T1 does not reach AVDD directly as well, but also slowly rises from a low level to AVDD, wherein, AVDD is smaller than VGH. When voltage of the high-level signal that is input at the non-inverting input terminal of the amplifier is greater than voltage of the third signal terminal AVDD, an emitter of the first transistor T1 is reverse biased, and its collector is reverse biased, so that the first transistor T1 is not conducting. While at this time, a fourth signal terminal VGL outputs a negative voltage, an emitter of a second transistor T2 is forward biased, and its collector is forward biased, so that the second transistor T2 is conducting. Owing to conducting of the second transistor T2, a first node CN2 is communicated with a fourth signal terminal VGL, so as to pull down potential of the first node CN2 to a low level. Because potential of the first node CN2 is a low level, an emitter of a third transistor T3 is forward biased, its collector is forward biased, and the third transistor T3 is conducting. As a result, a passage is formed between a data signal terminal DATA and a common voltage terminal VCOM, and this pulls down a potential of the data signal terminal DATA to a potential of the common voltage terminal VCOM. Namely, this causes the data signal terminal DATA and the common voltage terminal VCOM to reach the same voltage. A first resistor R1 and a second resistor R2 act to divide a voltage flowing to a fourth transistor T4, so that the fourth transistor T4 is switched on later than the third transistor T3. After the fourth transistor T4 gets conducting, the pulled-down voltage of the data signal terminal DATA and voltage of the common voltage terminal VCOM are released by a fifth signal terminal GND simultaneously. During this stage, a first capacitor C1, a second capacitor C2 and a third capacitor C3 each are charged.

At display stage, a low level is input from the control signal input terminal CN1 to the amplifier, and a low level is output from the amplifier to the first transistor T1 and the second transistor T2 under the control of a second signal terminal VSS. As potential of the second signal terminal VSS is smaller than potential of the fourth signal terminal VGL, the emitter of the second transistor T2 is reverse biased, its collector is reverse biased, and the second transistor T2 is not conducting; the emitter of the first transistor T1 is forward biased, its collector is forward biased, and the first transistor T1 is conducting. Thus, potential of the first node CN2 is pulled up to a high level. The third transistor T3 and the fourth transistor T4 are not conducting, and so the data signal terminal DATA, the common voltage terminal VCOM and the fifth signal terminal GND are disconnected from one another (at this time, the data signal terminal DATA, the common voltage terminal VCOM and the fifth signal terminal GND each have signals to input to a display panel, for allowing the display panel to perform display normally).

At shutdown stage, a high level is input from the control signal input terminal CN1 to the amplifier, and a high level is output from the amplifier to the first transistor T1 and the second transistor T2 under the control of a first signal terminal VGH. Thus, the emitter of the first transistor T1 is reverse biased, its collector is reverse biased, and the first transistor T1 is not conducting. While at this time, the fourth signal terminal VGL gradually changes to 0, and the first capacitor C1 provides a stabilized voltage to the emitter of the second transistor. Consequently, the emitter of the second transistor T2 is forward biased, its collector is forward biased, and the second transistor T2 is conducting. Because the second transistor T2 gets conducting, the first node CN2 is communicated with the first capacitor C1, so as to pull down potential of the first node CN2 to be a low level. Because potential of the first node CN2 is a low level (the second capacitor C2 provides a stabilized voltage to the first node CN2), the emitter of the third transistor T3 is forward biased, its collector is forward biased, and the third transistor T3 is conducting. As a result, a passage is formed between the data signal terminal DATA and the common voltage terminal VCOM, and a potential of the data signal terminal DATA is pulled down to a potential of the common voltage terminal VCOM. Namely, the data signal terminal DATA and the common voltage terminal VCOM are made to reach the same voltage, and a voltage difference between the data signal terminal DATA and the common voltage terminal VCOM is eliminated. The third capacitor C3 provides the first resistor R1 and the second resistor R2 with a stabilized voltage, so as to allow the first resistor R1 and a second resistor R2 to divide a voltage flowing to the fourth transistor T4, and this causes the fourth transistor T4 to be switched on later than the third transistor T3. After the fourth transistor T4 gets conducting, the pulled-down voltage of the data signal terminal DATA and voltage of the common voltage terminal VCOM are released by the fifth signal terminal GND simultaneously, so as to avoid charges remaining in the display panel.

It is to be noted that, because the first capacitor C1 and the second capacitor C2 need to provide stabilized voltages to the second transistor T2 and the first node CN2, respectively, the capacitance values of the first capacitor C1 and the second capacitor C2 each shall be larger. Resistance values of the first resistor R1 and the second resistor R2 are related to the time it takes for the data signal terminal DATA and the common voltage terminal VCOM to reach the same voltage, and can be obtained by calculating according to actual situations, details being omitted here.

A discharging circuit according to some embodiments of the present disclosure, includes a control circuit, a time delay circuit, a first discharging circuit and a second discharging circuit, and a connecting node among the control circuit, the time delay circuit and the first discharging circuit is a first node. Wherein, the control circuit takes control of switch-on of the first discharging circuit, so that a potential of a data signal terminal can be pulled down by the first discharging circuit to a potential of a common voltage terminal; the control circuit and the time delay circuit cooperate to delay the switched-on time of the second discharging circuit, so that residual charges at the data signal terminal with a pulled-down potential and residual charges at the common voltage terminal are conducted out by the second discharging circuit. This avoids such a problem that when the machine is shut down, a voltage difference is formed across liquid crystals owing to the fact that there remain some charges in the display device as a result of discharge of electricity from the common voltage terminal being unduly slow, so as to give rise to flicker or image sticking when the machine is started up again. Thus, the display quality is improved.

Figure 4:
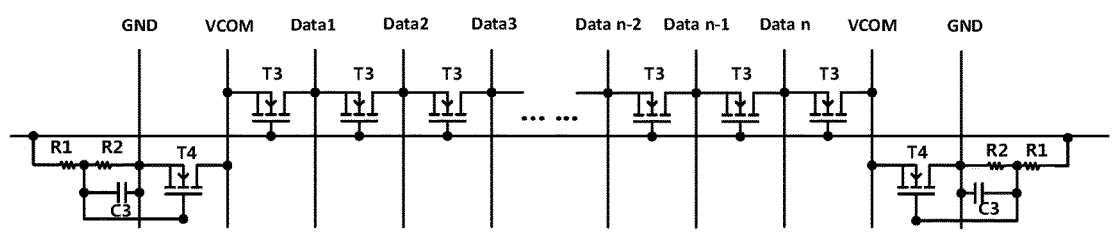
FIG. 4 is a structurally schematic view showing a display device according to some embodiments of the present disclosure.

Referring to FIG. 4, according to some embodiments of the present disclosure, there is provided a display device, including the discharging circuit as stated above. The display device may be a liquid crystal display panel, an electronic paper, a cell phone, a tablet computer, a television, a display, a notebook computer, a digital photoframe, a navigator or any other product or component having a display function.

The display device according to some embodiments of the present disclosure includes the aforesaid discharging circuit. For example, the discharging circuit includes a control circuit, a time delay circuit, a first discharging circuit and a second discharging circuit, and a connecting node among the control circuit, the time delay circuit and the first discharging circuit is a first node. Wherein, the control circuit takes control of switch-on of the first discharging circuit, so that a potential of a data signal terminal can be pulled down by the first discharging circuit to a potential of a common voltage terminal; the control circuit and the time delay circuit cooperate to delay the switched-on time of the second discharging circuit, so that residual charges at the data signal terminal with a pulled-down potential and residual charges at the common voltage terminal are conducted out by the second discharging circuit. This avoids such a problem that when the machine is shut down, a voltage difference is formed across liquid crystals owing to the fact that there remain some charges in the display device as a result of discharge of electricity from the common voltage terminal being unduly slow, so as to give rise to flicker or image sticking when the machine is started up again. Thus, the display quality is improved.

Referring to FIG. 5, according to some embodiments of the present disclosure, there is provided a driving method of a discharging circuit, including:
 at a start-up stage, pulling down, by a control circuit, potential of a first node, so as to switch on a first discharging circuit to pull down a potential of a data signal terminal to a potential of a common voltage terminal; delaying, by a time delay circuit, switch-on of a second discharging circuit, so as to release the potential of the common voltage terminal and the potential of the data signal terminal; meanwhile, charging a first voltage stabilizing circuit, a second voltage stabilizing circuit and the time delay circuit;
 at a display stage, promoting, by the control circuit, potential of the first node, so as to switch off the first discharging circuit and the second discharging circuit to cause the data signal terminal, the common voltage terminal and a fifth signal terminal to be disconnected from one another;
 at a shutdown stage, under control of a first voltage stabilizing circuit and a second voltage stabilizing circuit, pulling down, by the control circuit, potential of the first node, so as to switch on the first discharging circuit to pull down the potential of the data signal terminal to the potential of the common voltage terminal; delaying, by the time delay circuit, switch-on of the second discharging circuit, so as to release the potential of the common voltage terminal and the potential of the data signal terminal.

The driving method of the discharging circuit according to some embodiments of the present disclosure, is used for driving the discharging circuit as stated above.

The driving method of the discharging circuit according to some embodiments of the present disclosure, is used for driving the discharging circuit as stated above. For example, the discharging circuit includes a control circuit, a time delay circuit, a first discharging circuit and a second discharging circuit, and a connecting node among the control circuit, the time delay circuit and the first discharging circuit is a first node. Wherein, the control circuit takes control of switch-on of the first discharging circuit, so that a potential of a data signal terminal can be pulled down by the first discharging circuit to a potential of a common voltage terminal; the control circuit and the time delay circuit cooperate to delay the switched-on time of the second discharging circuit, so that residual charges at the data signal terminal with a pulled-down potential and residual charges at the common voltage terminal are conducted out by the second discharging circuit. This avoids such a problem that when the machine is shut down, a voltage difference is formed across liquid crystals owing to the fact that there remain some charges in the display device as a result of discharge of electricity from the common voltage terminal being unduly slow, so as to give rise to flicker or image sticking when the machine is started up again. Thus, the display quality is improved.

It is understandable that, the foregoing embodiments are merely exemplary embodiments used for explaining principle of the present disclosure, but the present disclosure is not limited to this. For those ordinarily skilled in the art, various variants and improvements can be made by them without departing from the spirit and essence of the present disclosure, and these variants and improvements shall also be deemed as the protection scope of the present disclosure.

What is claimed is:

1. A discharging circuit, comprising a control circuit, a time delay circuit, a first discharging circuit and a second discharging circuit;
the control circuit being connected to a control signal input terminal, a third signal terminal, a fourth signal terminal, the time delay circuit and the first discharging circuit, and the control circuit being configured to control potential of a control signal output terminal of the control circuit;
the time delay circuit being connected to the first discharging circuit and the second discharging circuit, and being configured to delay a switched-on time of the second discharging circuit;
the first discharging circuit being connected to a data signal terminal and a common voltage terminal, and being configured to pull down a potential of the data signal terminal to a potential of the common voltage terminal, under control of a control signal output from the control circuit; and
the second discharging circuit being connected to the common voltage terminal and a fifth signal terminal, and being configured to release the potential of the common voltage terminal and the potential of the data signal terminal under control of the time delay circuit.

2. The discharging circuit of claim 1, wherein:
the control circuit is connected to the control signal input terminal, a first node, the third signal terminal, the fourth signal terminal, the time delay circuit and the first discharging circuit, the first node is a node connected among the control circuit, the time delay circuit and the first discharging circuit, and the control circuit is configured to control potential of the first node.

3. The discharging circuit of claim 2, wherein: the control circuit includes a voltage output circuit and a sub-control circuit;
the voltage output circuit is connected to the control signal input terminal, a first signal terminal, a second signal terminal and the sub-control circuit, and is configured to transmit a signal input from the first signal terminal or a signal input from the second signal terminal to the sub-control circuit in light of a signal input from the control signal input terminal;
the sub-control circuit is connected to the first node, the third signal terminal, the fourth signal terminal, the time delay circuit and the first discharging circuit, and is configured to output a control signal under control of a voltage output from the voltage output circuit.

4. The discharging circuit of claim 3, wherein: the sub-control circuit includes a first transistor and a second transistor; wherein on-off characteristics of the first transistor and the second transistor are contrary;
a base of the first transistor is connected to the voltage output circuit and a base of the second transistor, an emitter of the first transistor is connected to the third signal terminal, and a collector of the first transistor is connected to the first node;
a base of the second transistor is connected to the voltage output circuit, an emitter of the second transistor is connected to the fourth signal terminal, and a collector of the second transistor is connected to the first node.

5. The discharging circuit of claim 4, wherein: the first discharging circuit includes a third transistor, and on-off characteristics of the third transistor and the first transistor are the same;
a base of the third transistor is connected to the first node and the time delay circuit, an emitter of the third transistor is connected to the common voltage terminal and the second discharging circuit, and a collector of the third transistor is connected to the data signal terminal.

6. The discharging circuit of claim 4, wherein: the second discharging circuit includes a fourth transistor, and on-off characteristics of the fourth transistor and the first transistor are the same;
a base of the fourth transistor is connected to the time delay circuit, an emitter of the fourth transistor is connected to the common voltage terminal, and a collector of the fourth transistor is connected to the time delay circuit and the fifth signal terminal.

7. The discharging circuit of claim 3, wherein: the voltage output circuit includes an amplifier; an input terminal of the amplifier is connected to the control signal input terminal, a non-inverting input terminal of the amplifier is connected to the first signal terminal, and an inverting input terminal of the amplifier is connected to the second signal terminal.

8. The discharging circuit of claim 2, wherein: the time delay circuit includes a first resistor and a second resistor;
a first end of the first resistor is connected to the first node and the first discharging circuit, and a second end of the first resistor is connected to a first end of the second resistor and the second discharging circuit;
a second end of the second resistor is connected to the fifth signal terminal and the second discharging circuit.

9. The discharging circuit of claim 8, wherein: the time delay circuit further comprises a third capacitor;
a first end of the third capacitor is connected to the second end of the first resistor, the first end of the second resistor and the second discharging circuit, and a second end of the third capacitor is connected to the second discharging circuit, the second end of the second resistor and the fifth signal terminal.

10. The discharging circuit of claim 2, further comprising a first voltage stabilizing circuit and a second voltage stabilizing circuit;
wherein: the first voltage stabilizing circuit is connected to the control circuit, the fourth signal terminal, the second voltage stabilizing circuit, the fifth signal terminal and the time delay circuit, and is configured to provide the control circuit with a stabilized voltage;
the second voltage stabilizing circuit is connected to the first node, the fifth signal terminal, the first discharging circuit and the time delay circuit, and configured to provide the first node with a stabilized voltage.

11. The discharging circuit of claim 10, wherein: the first voltage stabilizing circuit includes a first capacitor; and the second voltage stabilizing circuit includes a second capacitor;
a first end of the first capacitor is connected to the control circuit and the fourth signal terminal, and a second end of the first capacitor is connected to a second end of the second capacitor, the fifth signal terminal and the time delay circuit;
a first end of the second capacitor is connected to the first node, the first discharging circuit and the time delay circuit, and the second end of the second capacitor is connected to the fifth signal terminal and the time delay circuit.

12. A display device, comprising the discharging circuit of claim 1.

13. The display device of claim 12, wherein:
the control circuit is connected to the control signal input terminal, a first node, the third signal terminal, the fourth signal terminal, the time delay circuit and the first discharging circuit, the first node is a node connected among the control circuit, the time delay circuit and the first discharging circuit, and the control circuit is configured to control potential of the first node.

14. The display device of claim 13, wherein: the control circuit includes a voltage output circuit and a sub-control circuit;
the voltage output circuit is connected to the control signal input terminal, a first signal terminal, a second signal terminal and the sub-control circuit, and is configured to transmit a signal input from the first signal terminal or a signal input from the second signal terminal to the sub-control circuit in light of a signal input from the control signal input terminal;
the sub-control circuit is connected to the first node, the third signal terminal, the fourth signal terminal, the time delay circuit and the first discharging circuit, and is configured to output a control signal under control of a voltage output from the voltage output circuit.

15. The display device of claim 14, wherein: the sub-control circuit includes a first transistor and a second transistor, wherein on-off characteristics of the first transistor and the second transistor are contrary;
a base of the first transistor is connected to the voltage output circuit and a base of the second transistor, an emitter of the first transistor is connected to the third signal terminal, and a collector of the first transistor is connected to the first node;
a base of the second transistor is connected to the voltage output circuit, an emitter of the second transistor is connected to the fourth signal terminal, and a collector of the second transistor is connected to the first node.

16. The display device of claim 15, wherein: the first discharging circuit includes a third transistor, and on-off characteristics of the third transistor and the first transistor are the same;
a base of the third transistor is connected to the first node and the time delay circuit, an emitter of the third transistor is connected to the common voltage terminal and the second discharging circuit, and a collector of the third transistor is connected to the data signal terminal.

17. The display device of claim 14, wherein: the voltage output circuit includes an amplifier; an input terminal of the amplifier is connected to the control signal input terminal, a non-inverting input terminal of the amplifier is connected to the first signal terminal, and an inverting input terminal of the amplifier is connected to the second signal terminal.

18. The display device of claim 13, wherein: the time delay circuit includes a first resistor and a second resistor;
a first end of the first resistor is connected to the first node and the first discharging circuit, and a second end of the first resistor is connected to a first end of the second resistor and the second discharging circuit;
a second end of the second resistor is connected to the fifth signal terminal and the second discharging circuit.

19. The display device of claim 13, further comprising a first voltage stabilizing circuit and a second voltage stabilizing circuit;
wherein: the first voltage stabilizing circuit is connected to the control circuit, the fourth signal terminal, the second voltage stabilizing circuit, the fifth signal terminal and the time delay circuit, and is configured to provide the control circuit with a stabilized voltage;
the second voltage stabilizing circuit is connected to the first node, the fifth signal terminal, the first discharging circuit and the time delay circuit, and configured to provide the first node with a stabilized voltage.

20. A driving method of a discharging circuit, comprising:
at a start-up stage, pulling down, by a control circuit, potential of a first node-, so as to switch on a first discharging circuit to pull down a potential of a data signal terminal to a potential of a common voltage terminal; delaying, by a time delay circuit, switch-on of a second discharging circuit, so as to release the potential of the common voltage terminal and the potential of the data signal terminal; meanwhile, charging a first voltage stabilizing circuit, a second voltage stabilizing circuit and the time delay circuit;
at a display stage, promoting, by the control circuit, potential of the first node, so as to switch off the first discharging circuit and the second discharging circuit to cause the data signal terminal, the common voltage terminal and a fifth signal terminal to be disconnected from one another; and
at a shutdown stage, under control of a first voltage stabilizing circuit and a second voltage stabilizing circuit, pulling down, by the control circuit, a potential of the first node, so as to switch on the first discharging circuit to pull down the potential of the data signal terminal to the potential of the common voltage terminal; delaying, by the time delay circuit, switch-on of the second discharging circuit, so as to release the potential of the common voltage terminal and the potential of the data signal terminal.

* * * * *